United States Patent
Kim

(10) Patent No.: US 11,719,754 B2
(45) Date of Patent: Aug. 8, 2023

(54) BATTERY MANAGEMENT SYSTEM FOR INTEGRATED MANAGEMENT OF HIGH AND LOW VOLTAGE BATTERIES AND COMMUNICATION METHOD THEREOF

(71) Applicant: HYUNDAI MOBIS CO., LTD., Seoul (KR)

(72) Inventor: Seulkirom Kim, Seoul (KR)

(73) Assignee: HYUNDAI MOBIS CO., LTD., Seoul (KR)

( * ) Notice: Subject to any disclaimer, the term of this patent is extended or adjusted under 35 U.S.C. 154(b) by 171 days.

(21) Appl. No.: 17/088,392

(22) Filed: Nov. 3, 2020

(65) Prior Publication Data

US 2021/0141026 A1   May 13, 2021

(30) Foreign Application Priority Data

Nov. 11, 2019  (KR) .......................... 10-2019-0143310

(51) Int. Cl.
*G01R 31/3842* (2019.01)
*H01M 10/42* (2006.01)

(52) U.S. Cl.
CPC ...... *G01R 31/3842* (2019.01); *H01M 10/425* (2013.01); *H01M 2010/4271* (2013.01); *H01M 2010/4278* (2013.01); *H01M 2220/20* (2013.01)

(58) Field of Classification Search
None
See application file for complete search history.

(56) References Cited

U.S. PATENT DOCUMENTS

| 8,456,132 | B2 * | 6/2013 | Kinoshita | H01M 10/482 320/132 |
| 9,269,991 | B2 * | 2/2016 | Takeshita | H02J 7/0047 |
| 10,895,603 | B2 * | 1/2021 | Kiuchi | B60L 3/04 |
| 2018/0372804 | A1 | 12/2018 | Yamazaki et al. | |

FOREIGN PATENT DOCUMENTS

| CN | 103444046 A | 12/2013 |
| CN | 103580089 A | 2/2014 |
| CN | 103928955 A | 7/2014 |
| CN | 106740125 A | 5/2017 |

(Continued)

OTHER PUBLICATIONS

Korean Office Action for Korean Application No. 10-2019-0143310 dated Feb. 22, 2021 (5 pgs).

(Continued)

*Primary Examiner* — Roy Y Yi
(74) *Attorney, Agent, or Firm* — Morgan, Lewis & Bockius LLP

(57) ABSTRACT

A battery management system for integrated management of high and low voltage batteries may include: a control unit; a low voltage monitoring unit connected to the control unit, and configured to transmit a monitoring result for a low voltage battery to the control unit; and a high voltage monitoring unit including a plurality of sensing ICs connected to each other in a daisy chain manner, wherein at least one sensing IC of the plurality of sensing ICs is connected to the low voltage monitoring unit, and transmits a monitoring result for a high voltage battery to the control unit through the low voltage monitoring unit.

14 Claims, 2 Drawing Sheets

(56) References Cited

FOREIGN PATENT DOCUMENTS

| | | |
|---|---|---|
| EP | 2664158 B1 | 8/2017 |
| JP | 2015088868 | 5/2015 |
| JP | 5937011 B2 | 6/2016 |
| KR | 10-0869709 B1 | 11/2008 |
| KR | 2013-0065351 A | 6/2013 |
| KR | 10-2013-0127056 A | 11/2013 |
| KR | 10-2019-0113220 A | 10/2019 |

OTHER PUBLICATIONS

Notice of Allowance issued in corresponding Korean Patent Application No. 10-2019-0143310 dated Apr. 29, 2022.
Office Action issued in corresponding Chinese Patent Application No. 202011172271.7 dated May 20, 2023, with English translation.

\* cited by examiner

[FIG 1]
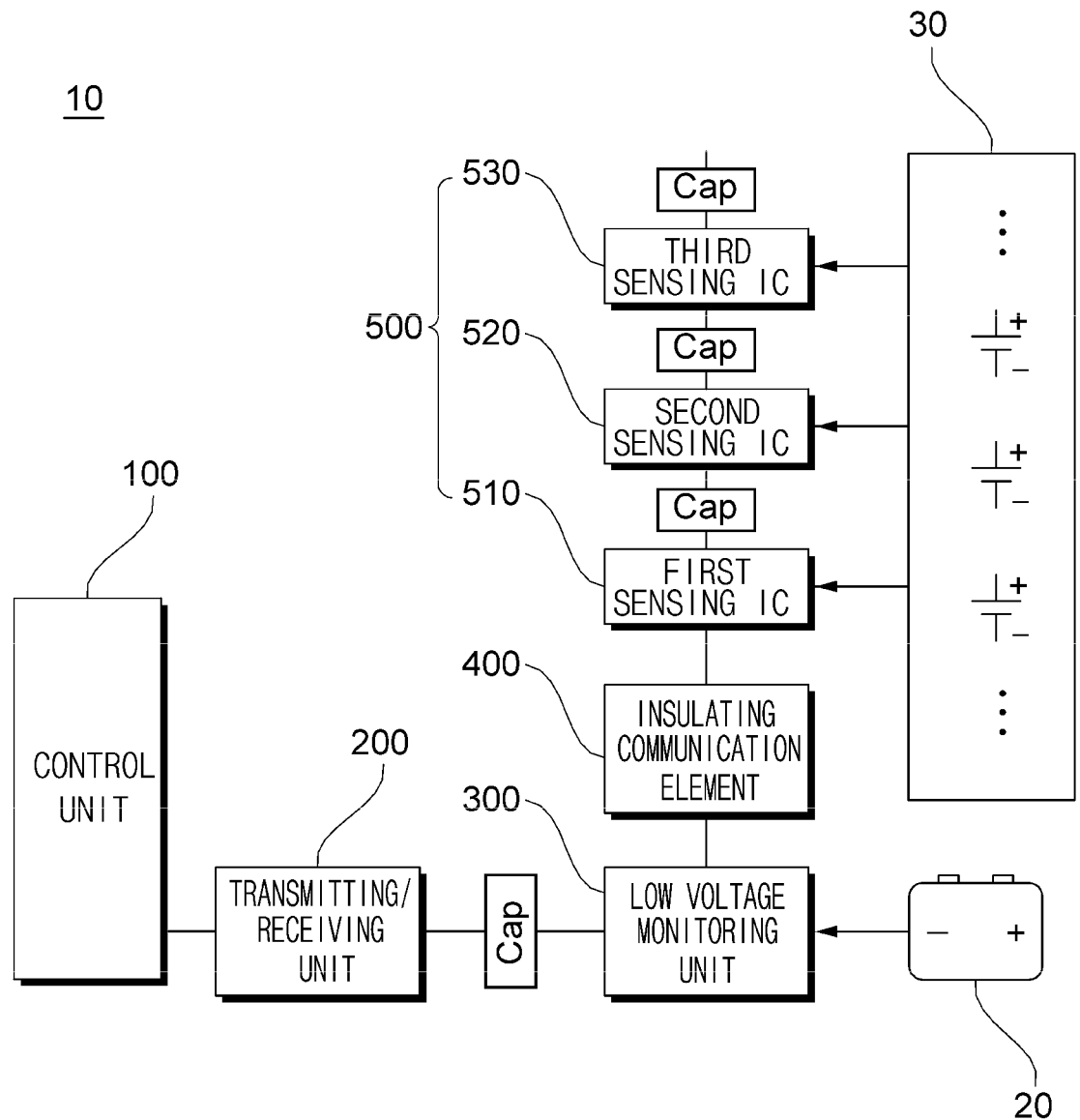

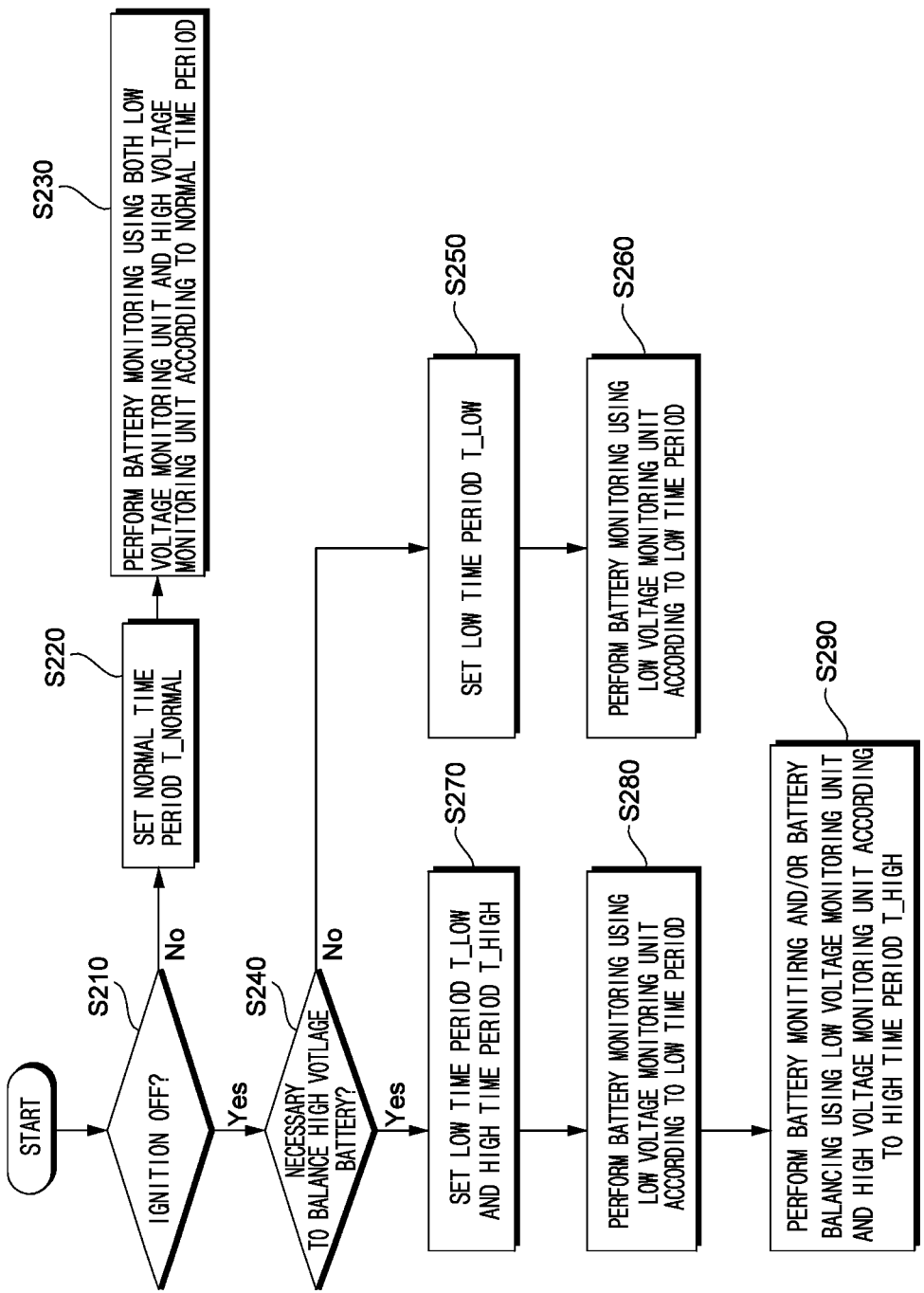

BATTERY MANAGEMENT SYSTEM FOR INTEGRATED MANAGEMENT OF HIGH AND LOW VOLTAGE BATTERIES AND COMMUNICATION METHOD THEREOF

CROSS-REFERENCE TO RELATED APPLICATION

The present application claims priority to and the benefit of Korean Patent Application No. 10-2019-0143310 filed on Nov. 11, 2019, the entire contents of which are incorporated herein by reference.

TECHNICAL FIELD

The present disclosure relates to a battery management system, for example, a battery management system for integrated management of high and low voltage batteries and a communication method thereof.

BACKGROUND

A vehicle which uses an internal combustion engine using fossil fuel, such as gasoline or heavy oil, as main fuel causes serious problems such as air pollution. Recently, in order to reduce air pollution, an electric vehicle or hybrid vehicle is developed and used.

The electric vehicle includes a high voltage battery (e.g. 240 V) for supplying a high voltage to a vehicle driving motor, and a low voltage battery (e.g. 12 V) for supplying a low voltage to other internal electronic devices of the vehicle.

The high voltage battery includes a plurality of battery cells connected in series, and all electronic devices within the vehicle use a chassis as ground. Thus, for the safety of a user, the high voltage battery is configured to be insulated from the chassis ground. On the other hand, the low voltage battery is grounded to the chassis ground because an accident risk is relatively low.

The electric vehicle requires a battery management system which can monitor the charge states and discharge states of the low voltage battery and the high voltage battery, and effectively manage the low voltage battery and the high voltage battery.

The battery management system according to the related art is configured to separately monitor the low voltage battery and the high voltage battery.

That is, the battery management system according to the related art includes a low voltage monitoring system for monitoring the low voltage battery and a high voltage monitoring system for monitoring the high voltage battery.

The low voltage monitoring system and the high voltage monitoring system use different types of communication methods, and thus are not compatible with each other.

The high voltage monitoring system cannot monitor the low voltage battery due to the minimum operating voltage.

In other words, since the battery management system according to the related art needs to include both the low voltage monitoring system and the high voltage monitoring system, the configuration complexity of the battery management system and the complexity of internal software logic of the battery management system may be increased.

SUMMARY

The present disclosure provides a battery management system for integrated management of high and low voltage batteries, which can monitoring a low voltage battery and a high voltage battery at the same time through a single communication method, and a communication method thereof.

An exemplary embodiment of the present disclosure provides a battery management system for integrated management of high and low voltage batteries, including: a control unit; a low voltage monitoring unit connected to the control unit, and configured to transmit a monitoring result for a low voltage battery to the control unit; and a high voltage monitoring unit comprising a plurality of sensing ICs connected to each other in a daisy chain manner, wherein at least one sensing IC among the plurality of sensing ICs is connected to the low voltage monitoring unit, and transmits a monitoring result for a high voltage battery to the control unit through the low voltage monitoring unit.

The battery management system may further include an insulating communication element configured to connect the at least one sensing IC to the low voltage monitoring unit.

The insulating communication element may be connected between the respective sensing ICs.

The insulating communication element may be connected between the control unit and the low voltage monitoring unit.

The control unit may set a high time period from a point of time that a control signal for controlling the high voltage monitoring unit is transmitted to a point of time that information of the last sensing IC among the sensing ICs is received.

When an ignition of a vehicle is off and it is necessary to perform voltage balancing on the high voltage battery, the control unit may control the low voltage monitoring unit and the high voltage monitoring unit to repeatedly monitor the low voltage battery and the high voltage battery according to the high time period, and perform voltage balancing on the high voltage battery.

The control unit may set a low time period from a point of time that a control signal for controlling the low voltage monitoring unit is transmitted to a point of time that information of the low voltage monitoring unit is received.

When an ignition of a vehicle is off and it is unnecessary to perform voltage balancing on the high voltage battery, the control unit may control the low voltage monitoring unit to repeatedly monitor the low voltage battery according to the low time period.

Another exemplary embodiment of the present disclosure provides a communication method of a battery management system which includes a control unit, a low voltage monitoring unit connected to the control unit, and a high voltage monitoring unit connected to the low voltage monitoring unit and including a plurality of sensing ICs connected to each other in a daisy chain manner, the communication method including: a monitoring step of monitoring a low voltage battery using the low voltage monitoring unit, and transmitting the monitoring result to the control unit; and a balancing step of performing voltage balancing on a high voltage battery using the plurality of sensing ICs, and transmitting the balancing result to the control unit through the low voltage monitoring unit.

The communication method may further include a balancing determination step of determining whether it is necessary to perform voltage balancing on the high voltage battery, when an ignition of a vehicle is off.

The communication method may further include a time period setting step of setting a low time period and a high time period, when it is necessary to perform voltage balancing on the high voltage battery.

The low time period may indicate a signal transmission period required until a response signal of the low voltage monitoring unit is received according to a control signal of the control unit, while the vehicle is parked.

The high time period may indicate a signal transmission period required until a response signal of the high voltage monitoring unit is received according to a control signal of the control unit, while the vehicle is parked.

The high time period may be n times longer than the low time period, where n is an integer equal to or greater than 2.

According to exemplary embodiments of the present disclosure, the battery management system for integrated management of high and low voltage batteries and the communication method thereof can manage the low voltage battery and the high voltage battery at the same time through a single communication method, thereby not only reducing the number of system components but also reducing the logic complexity of system software.

The foregoing summary is illustrative only and is not intended to be in any way limiting. In addition to the illustrative aspects, embodiments, and features described above, further aspects, embodiments, and features will become apparent by reference to the drawings and the following detailed description.

DRAWINGS

FIG. 1 is a block diagram illustrating a battery management system for integrated management of high and low voltage batteries in one form of the present disclosure.

FIG. 2 is a flowchart illustrating a communication method of the battery management system in one form of the present disclosure.

It should be understood that the appended drawings are not necessarily to scale, presenting a somewhat simplified representation of various features illustrative of the basic principles of the disclosure. The specific design features of the present disclosure as disclosed herein, including, for example, specific dimensions, orientations, locations, and shapes will be determined in part by the particular intended application and use environment.

In the figures, reference numbers refer to the same or equivalent parts of the present disclosure throughout the several figures of the drawing.

DETAILED DESCRIPTION

Hereinafter, exemplary embodiments of the present disclosure will be described in detail with reference to the accompanying drawings. First, the same components in the respective drawings will be represented by like reference numerals even though the components are illustrated in different drawings. Also, although the exemplary embodiments of the present disclosure are described, the scope of the present disclosure is not limited thereto, but the present disclosure can be modified and carried out in various manners by those skilled in the art.

FIG. 1 is a block diagram illustrating a battery management system for integrated management of high and low voltage batteries in some forms of the present disclosure.

Referring to FIG. 1, a battery management system 10 for integrated management of high and low voltage batteries in some forms of the present disclosure includes a control unit 100, a transmitting/receiving unit 200, a low voltage monitoring unit 300, an insulating communication element 400 and a high voltage monitoring unit 500.

The battery management system 10 for integrated management of high and low voltage batteries in some forms of the present disclosure may monitor both of a low voltage battery 20 and a high voltage battery 30 through a single communication method, and perform voltage balancing on the high voltage battery 30.

The low voltage battery 20 is a power source of an internal electronic device of a vehicle. The low voltage battery 20 may have a voltage of about 12V, but the voltage thereof is not limited thereto. The low voltage battery 20 may be monitored by the low voltage monitoring unit 300 even when the ignition of the vehicle is off. The low voltage battery 20 may receive power from the high voltage battery 30 when the low voltage battery 20 needs to be charged.

The high voltage battery 30 is a power source for a motor operation of driving the vehicle. The high voltage battery 30 may be constituted by a plurality of battery cells which are connected in series. The high voltage battery 30 may have a voltage of about 240V, but the voltage thereof is not limited thereto. Each of the battery cells of the high voltage battery 30 may be monitored by the high voltage monitoring unit 500 even when the ignition of the vehicle is off. The voltages of the battery cells of the high voltage battery 30 may be balanced by the high voltage monitoring unit 500.

The control unit 100 may control the low voltage monitoring unit 300 and the high voltage monitoring unit 500 to monitor the states of the low voltage battery 20 and the high voltage battery 30. The control unit 100 may control the high voltage monitoring unit 500 to perform voltage balancing on the high voltage battery 30. The control unit 100 may transmit a control signal to the low voltage monitoring unit 300 and the high voltage monitoring unit 500 through a single communication line. The control unit 100 may receive monitoring information of the low voltage monitoring unit 300 and the high voltage monitoring unit 500 through a single communication line.

The transmitting/receiving unit 200 may transmit the control signal of the control unit 100 to the low voltage monitoring unit 300. In an embodiment, the transmitting/receiving unit 200 may be a communication IC. The transmitting/receiving unit 200 may be connected to the low voltage monitoring unit 300 through an insulating communication element Cap. The transmitting/receiving unit 200 may receive the monitoring information of the low voltage battery 20 and the monitoring information of the high voltage battery 30 from the low voltage monitoring unit 300, and transmit the received information to the control unit 100.

The low voltage monitoring unit 300 may monitor the low voltage battery 20 under control of the control unit 100. The low voltage monitoring unit 300 may provide a diagnosis and fault detection function of diagnosing and detecting whether a low voltage of the low voltage battery 20 is generated or wire connection is abnormal.

The low voltage monitoring unit 300 may include a transmitting unit Tx and a receiving unit Rx which are connected to the insulating communication element Cap. The low voltage monitoring unit 300 may transmit monitoring information on the low voltage battery 20 to the transmitting/receiving unit 200. The low voltage monitoring unit 300 may also transmit information, received from the high voltage monitoring unit 500, to the transmitting/receiving unit 200.

The insulating communication element 400 connects the low voltage monitoring unit 300 and the high voltage monitoring unit 500. In an embodiment, the insulating communication element 400 may be an insulating capacitor. The insulating communication element 400 may transfer the control signal of the control unit 100 from the low voltage monitoring unit 300 to the high voltage monitoring unit 500. The insulating communication element 400 may transfer monitoring information of the high voltage battery of the high voltage monitoring unit 500 to the low voltage monitoring unit 300.

The high voltage monitoring unit 500 may include a plurality of sensing ICs. The plurality of sensing ICs 510, 520 and 530 may include a first sensing IC 510, a second sensing IC 520 and a third sensing IC 530. The number of sensing ICs included in the high voltage monitoring unit 500 is not limited to the above-described number, but may include a larger number of sensing ICs according to the number of battery cells in the high voltage battery 30.

The plurality of sensing ICs 510, 520 and 530 may be connected to each other in a daisy chain manner. The daisy chain indicates a configuration of hardware devices which are consecutively connected. For example, the daisy chain refers to a bus connection method in which a certain device A is connected to a device B and the device B is consecutively connected to a device C.

That is, the first sensing IC 510 may be connected to the second sensing IC 520, and the second sensing IC 520 may be connected to the third sensing IC 530. Among the respective sensing ICs 510, 520 and 530, the insulating communication element Cap for circuit connection may be provided.

In an embodiment, the first sensing IC 510, the second sensing IC 520 and the third sensing IC 530 may be battery cell sensing ICs. Each of the first to third sensing ICs 510, 520 and 530 may perform a monitoring and voltage balancing function for the corresponding battery cell of the high voltage battery 30. The voltage balancing indicates that differences in voltage among a plurality of cells constituting a battery fall within a permissible range.

Each of the first to third sensing ICs 510, 520 and 530 may provide a diagnosis and fault detection function of diagnosing and detecting whether an overvoltage of the corresponding battery cell is generated, the corresponding battery cell is abnormal, or wire connection is abnormal.

The information of each of the first to third sensing ICs 510, 520 and 530 may be transferred to the control unit 100 through a single communication line. In an embodiment, the information of the first sensing IC 510 may be transmitted to the control unit 100 after sequentially passing through the insulating communication element 400, the low voltage monitoring unit 300 and the transmitting/receiving unit 200.

The information of the second sensing IC 520 may be transmitted to the control unit 100 after sequentially passing through the first sensing IC 510, the insulating communication element 400, the low voltage monitoring unit 300 and the transmitting/receiving unit 200.

The information of the third sensing IC 530 may be transmitted to the control unit 100 after sequentially passing through the second sensing IC 520, the first sensing IC 510, the insulating communication element 400, the low voltage monitoring unit 300 and the transmitting/receiving unit 200.

Therefore, the battery management system 10 for integrated management of high and low voltage batteries in some forms of the present disclosure can process cell information through a smaller number of constituent parts than the existing configuration, thereby significantly lowering the complexity of the system components and the complexity of the system logic.

FIG. 2 is a flowchart illustrating a communication method of the battery management system in some forms of the present disclosure.

Referring to FIG. 2, the communication method of the battery management system may include an ignition off determination step S210, a first time period setting step S220, a first monitoring step S230, a balancing determination step S240, a second time period setting step S250, a second monitoring step S260, a third time period setting step S270, a third monitoring step S280 and a balancing step S290.

In the ignition off determination step S210, the control unit 100 receives start-up information from a vehicle starter switch, and determines whether the ignition is off (IG Off.

In the first time period setting step S220, the control unit 100 sets a normal time period T_Normal, when the ignition of the vehicle is on (IG On). The normal time period indicates a signal transmission period required until the control unit 100 receives a response signal of the high voltage monitoring unit 500 according to the control signal of the control unit 100 during driving.

In the first monitoring step S230, the control unit 100 transmits the control signal according to the normal time period. The low voltage monitoring unit 300 monitors the low voltage battery 20 according to the control signal of the control unit 100. The high voltage monitoring unit 500 monitors the high voltage battery 30 according to the control signal of the control unit 100. The high voltage monitoring unit 500 transmits the monitoring result for the high voltage battery 30 to the low voltage monitoring unit 300. The low voltage monitoring unit 300 transmits the monitoring result for the low voltage battery 20 to the control unit 100. The low voltage monitoring unit 300 transmits the monitoring result for the high voltage battery 30 to the control unit 100. The first monitoring step S230 may be repeated according to the normal time period while the ignition of the vehicle is on (IG On).

In the balancing determination step S240, the control unit 100 determines whether it is necessary to perform voltage balancing on the high voltage battery, when the ignition of the vehicle is off. The control unit 100 determines whether it is necessary to perform voltage balancing on the high voltage battery, through the received monitoring result for the high voltage battery 30.

In the second time period setting step S250, the control unit 100 may set a low time period T_Low, when it is unnecessary to perform voltage balancing on the high voltage battery 30. The low time period indicates a signal transmission period required until the control unit 100 receives a response signal of the low voltage monitoring unit 300 according to the control signal of the control unit 100, while the vehicle is parked.

In the second monitoring step S260, the control unit 100 transmits the control signal according to the low time period. The low voltage monitoring unit 300 monitors the low voltage battery 20 according to the control signal of the control unit 100. The low voltage monitoring unit 300 transmits the monitoring result for the low voltage battery 20 to the control unit 100. The second monitoring step S260 may be repeated according to the low time period while the ignition of the vehicle is off (IG Off).

In the third time period setting step S270, the control unit 100 may set the low time period T_Low and a high time period T_High, when it is necessary to perform voltage balancing on the high voltage battery 30. The high time period indicates a signal transmission period required until the control unit 100 receives a response signal of the high voltage monitoring unit 500 according to the control signal of the control unit 100, while the vehicle is parked. The high time period T_High may be n times longer than the low time period T_Low, where n is an integer equal to or greater than 2.

In the third monitoring step S280, the control unit 100 transmits the control signal according to the low time period. The low voltage monitoring unit 300 monitors the low voltage battery 20 according to the control signal of the control unit 100. The low voltage monitoring unit 300 transmits the monitoring result for the low voltage battery 20 to the control unit 100. The third monitoring step S280 may be repeated according to the low time period while the ignition of the vehicle is off (IG Off).

In the balancing step S290, the control unit 100 transmits the control signal according to the high time period, when the third monitoring step S280 according to the low time period is completed. The low voltage monitoring unit 300 monitors the low voltage battery 20 according to the control signal of the control unit 100. The high voltage monitoring unit 500 monitors the high voltage battery 30 according to the control signal of the control unit 100. The high voltage monitoring unit 500 performs voltage balancing on the battery cells of the high voltage battery 30, which need to be balanced. The high voltage monitoring unit 500 transmits the monitoring result for the high voltage battery 30 to the low voltage monitoring unit 300. The low voltage monitoring unit 300 transmits the monitoring result for the low voltage battery 20 and the monitoring result for the high voltage battery 30 to the control unit 100. The balancing step S290 may be repeated according to the high time period while the ignition of the vehicle is off (IG Off).

The above description is simply given for illustratively describing the technical spirit of the present disclosure, and those skilled in the art to which the present disclosure pertains will appreciate that various modifications, changes, and substitutions are possible without departing from the essential characteristic of the present disclosure. Accordingly, the exemplary embodiments disclosed in the present disclosure and the accompanying drawings are intended not to limit but to describe the technical spirit of the present disclosure, and the scope of the technical spirit of the present disclosure is not limited by the exemplary embodiments and the accompanying drawings.

The steps and/or the operations according to the present disclosure may be simultaneously incurred in other exemplary embodiments in a different order, in parallel, or for another epoch, which will be understood by those skilled in the art.

Depending on an exemplary embodiment, a part or all of the steps and/or the operations may be implemented or performed by using one or more processors driving a command stored in one or more non-temporary computer-readable media, a program, an interactive data structure, a client, and/or a server. An example of the one or more non-temporary computer-readable media may be software, firmware, hardware, and/or any combination thereof. Further, a function of "module" discussed in the present specification may be implemented by software, firmware, hardware, and/or any combination thereof.

Meanwhile, the embodiments according to the present disclosure may be implemented in the form of program instructions that can be executed by computers, and may be recorded in computer readable media. The computer readable media may include program instructions, a data file, a data structure, or a combination thereof. By way of example, and not limitation, computer readable media may comprise computer storage media and communication media. Computer storage media includes both volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can accessed by computer. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of any of the above should also be included within the scope of computer readable media.

As described above, the exemplary embodiments have been described and illustrated in the drawings and the specification. The exemplary embodiments were chosen and described in order to explain certain principles of the disclosure and their practical application, to thereby enable others skilled in the art to make and utilize various exemplary embodiments of the present disclosure, as well as various alternatives and modifications thereof. As is evident from the foregoing description, certain aspects of the present disclosure are not limited by the particular details of the examples illustrated herein, and it is therefore contemplated that other modifications and applications, or equivalents thereof, will occur to those skilled in the art. Many changes, modifications, variations and other uses and applications of the present construction will, however, become apparent to those skilled in the art after considering the specification and the accompanying drawings. All such changes, modifications, variations and other uses and applications which do not depart from the spirit and scope of the disclosure are deemed to be covered by the disclosure which is limited only by the claims which follow.

What is claimed is:

1. A battery management system for integrated management of high and low voltage batteries, comprising:
    a control unit;
    a low voltage monitoring unit connected to the control unit, and configured to transmit a monitoring result for the low voltage battery to the control unit; and
    a high voltage monitoring unit comprising a plurality of sensing ICs connected to each other in a daisy chain manner,
    wherein at least one sensing IC of the plurality of sensing ICs is connected to the low voltage monitoring unit, and configured to transmit a monitoring result for the high voltage battery to the control unit through the low voltage monitoring unit, and
    wherein the low voltage battery is separately disposed from the high voltage battery.

2. The battery management system of claim 1, wherein the system further comprises an insulating communication unit configured to connect the at least one sensing IC to the low voltage monitoring unit.

3. The battery management system of claim 1, wherein the insulating communication unit is connected between the plurality of sensing ICs.

4. The battery management system of claim 1, wherein the insulating communication unit is connected between the control unit and the low voltage monitoring unit.

5. The battery management system of claim 1, wherein the control unit is configured to:
   set a high time period from a first time that a control signal for controlling the high voltage monitoring unit is transmitted to a second time that information of a last sensing IC of the plurality of sensing ICs is received.

6. The battery management system of claim 5, wherein, when an ignition of a vehicle is off and voltage balancing on the high voltage battery is required, the control unit is configured to:
   control the low voltage monitoring unit and the high voltage monitoring unit to repeatedly monitor the low voltage battery and the high voltage battery according to the high time period; and
   perform voltage balancing on the high voltage battery.

7. The battery management system of claim 1, wherein the control unit is configured to:
   set a low time period from a third time that a control signal for controlling the low voltage monitoring unit is transmitted to a fourth time that information of the low voltage monitoring unit is received.

8. The battery management system of claim 7, wherein, when an ignition of a vehicle is off and voltage balancing on the high voltage battery is required, the control unit is configured to:
   control the low voltage monitoring unit to repeatedly monitor the low voltage battery according to the low time period.

9. A communication method of a battery management system which includes a control unit, a low voltage monitoring unit connected to the control unit, and a high voltage monitoring unit connected to the low voltage monitoring unit and including a plurality of sensing ICs connected to each other in a daisy chain manner, the method comprising:
   monitoring a low voltage battery using the low voltage monitoring unit, and transmitting a monitoring result to the control unit; and
   performing voltage balancing on a high voltage battery using the plurality of sensing ICs, and transmitting a balancing result to the control unit through the low voltage monitoring unit,
   wherein the low voltage battery is separately disposed from the high voltage battery.

10. The communication method of claim 9, wherein the method further comprises:
    when an ignition of a vehicle is off, determining whether voltage balancing on the high voltage battery is required.

11. The communication method of claim 10, wherein the method further comprises:
    when it is determined that the voltage balancing on the high voltage battery is required, setting a low time period and a high time period.

12. The communication method of claim 11, wherein the low time period includes a signal transmission period required until a response signal of the low voltage monitoring unit is received according to a control signal of the control unit while the vehicle is parked.

13. The communication method of claim 11, wherein the high time period includes a signal transmission period required until a response signal of the high voltage monitoring unit is received according to a control signal of the control unit while the vehicle is parked.

14. The communication method of claim 13, wherein the high time period is n times longer than the low time period, where n is an integer equal to or greater than 2.

\* \* \* \* \*